United States Patent
Momtaz

(10) Patent No.: US 6,549,599 B2
(45) Date of Patent: Apr. 15, 2003

(54) STABLE PHASE LOCKED LOOP HAVING SEPARATED POLE

(75) Inventor: Afshin Momtaz, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/095,556

(22) Filed: Mar. 11, 2002

(65) Prior Publication Data

US 2002/0101948 A1 Aug. 1, 2002

Related U.S. Application Data

(60) Division of application No. 09/615,033, filed on Jul. 12, 2002, now Pat. No. 6,389,092, which is a continuation-in-part of application No. 09/540,243, filed on Mar. 31, 2000.
(60) Provisional application No. 60/148,379, filed on Aug. 11, 1999.

(51) Int. Cl.[7] .......................... H03L 7/093; H03L 7/089
(52) U.S. Cl. .......................... 375/376; 327/157; 331/14; 331/17
(58) Field of Search .......................... 375/374, 376; 327/147, 148, 156, 157; 331/10, 12, 14, 17, 18, 25, 32, 36 R

(56) References Cited

U.S. PATENT DOCUMENTS

| | | | | |
|---|---|---|---|---|
| 5,384,502 A | * | 1/1995 | Volk | 327/157 |
| 5,389,899 A | * | 2/1995 | Yahagi et al. | 331/10 |
| 5,400,372 A | * | 3/1995 | Watanabe et al. | 331/25 |
| 5,570,398 A | * | 10/1996 | Smith | 327/156 |
| 5,757,216 A | * | 5/1998 | Murata | 327/147 |
| 5,831,483 A | * | 11/1998 | Fukuda | 331/17 |
| 5,864,249 A | * | 1/1999 | Shoji | 327/156 |
| 5,867,333 A | * | 2/1999 | Saiki et al. | 327/157 |
| 5,983,077 A | * | 11/1999 | Dent | 332/128 |
| 6,011,440 A | * | 1/2000 | Bell et al. | 330/202 |
| 6,140,853 A | * | 10/2000 | Lo | 327/142 |
| 6,229,362 B1 | * | 5/2001 | Choi | 327/157 |
| 6,389,092 B1 | | 5/2002 | Momtaz | |

OTHER PUBLICATIONS

Proakis, John G., and Manolakis, Dimitris G., *Digital Signal Processing Principles, Algorithms, and Applications*, Macmillan Publishing Company, pp. v. vi, 345–350, 10 pp, 1992.

* cited by examiner

*Primary Examiner*—Young T. Tse
(74) *Attorney, Agent, or Firm*—Townsend and Townsend and Crew LLP; Henry K. Woodward

(57) ABSTRACT

A phase locked loop circuit having a loop filter including a variable resistance for normal loop operation and for fast acquisition has improved stability by defining a loop pole separate from the loop filter. The loop pole remains constant during transition periods of the filter resistance. The loop pole remains constant while loop bandwidth is varied for either phase acquisition or normal operation, and the ratio of bandwidth to pole varies only linearly which makes the phase locked loop more stable during the bandwidth adjustment.

10 Claims, 3 Drawing Sheets

STABLE PHASE LOCKED LOOP HAVING SEPARATED POLE

CROSS-REFERENCES TO RELATED APPLICATIONS

This application is a division of U.S. application Ser. No. 09/615,033, filed Jul. 12, 2002, now U.S. Pat. No. 6,389,092 B1, which is a CIP of U.S. application Ser. No. 09/540,243, filed Mar. 31, 2000, which claims the benefit of U.S. Provisional Application Ser. No. 60/148,379, filed Aug. 11, 1999.

BACKGROUND OF THE INVENTION

This invention relates generally to electronic circuits, and more particularly the invention relates to phase locked loop circuits. A phase locked loop (PLL) is commonly used in many electronics applications to maintain a fixed phase relationship between an input (e.g., clock) signal and a reference signal. A phase locked loop designed for a digital application typically includes a phase and/or frequency detector, a charge pump, a loop filter, a VCO, and an (optional) divider. The phase detector determines the phase differences between an input signal (i.e., an input data stream or an input clock) and a reference signal derived from the VCO, and generates a detector output signal indicative of the detected phase differences. The charge pump receives the detector output signal and generates a set of phase error signals (e.g., UP and DOWN). The loop filter filters the phase error signals to generate a control signal that is then used to adjust the frequency of the VCO such that the frequencies of the two signals provided to the phase detector are locked.

FIG. 1 is a block diagram of a conventional phase locked loop 100. An input signal is provided to a phase detector 110 that also receives a reference signal from a divider 123. The input signal can be a clock signal, a data stream, or some other types of signal having phase and/or frequency information to which the phase locked loop can locked. The reference signal is typically a clock signal used to trigger the phase detector. Phase detector 110 generates an output signal PDOUT indicative of the timing differences (i.e., the phase differences) between the input signal and the reference signal. The PDOUT signal is provided to a charge pump 114 that generates an output signal CPOUT indicative of the detected phase error between the input and reference signals. In some designs, the PDOUT signal is logic high if the phase of the input signal is early (or late) relative to that of the reference signal, logic low if the phase of the input signal is late (or early) relative to that of the reference signal, and tri-stated for a period of time between clock edges.

The CPOUT signal is provided to a loop filter 120 that filters the signal with a particular transfer characteristic to generate a control signal. The control signal is then provided to, and used to control the frequency of, a voltage-controlled oscillator (VCO) 122. VCO 122 generates an output clock CLK_OUT having a frequency that is locked to that of the input signal (when the phase locked loop is locked). The output clock is provided to divider 123 that divides the frequency of the output clock by a factor of N to generate the reference signal. Divider 123 is optional and not used when the frequency of the output clock is the same as that of the input signal (i.e., N=1). The control signal adjusts the frequency of VCO 122 such that the frequencies of the two signals provided to phase detector 110 are locked.

The charge pump typically requires an input signal having rail-to-rail signal swing and sharp edges. Signals meeting these requirements can be readily provided by a phase detector at (relatively) low operating frequencies. However, at higher frequencies (e.g., 2.488 GHz for a SONET OC-48 transceiver), it is difficult to design a phase detector having rail-to-rail signal swing and sharp edges. To provide the required signal characteristics, the phase detector would typically need to be designed using a combination of large die area and large amounts of bias current. Besides the design challenge for such phase detector, the rail-to-rail signal swing and sharp edges generate large amounts of noise that can degrade the performance of the phase locked loop and other nearby circuits.

The present invention is directed to improving the stability of a phase locked loop circuit.

SUMMARY OF THE INVENTION

Briefly, and in accordance with the invention, a pole associated with a loop filter is separated and placed after a phase detector and before a signal processing circuit such as a charge pump or transconductance amplifier. Thus, changes in filter resistance for "fast lock" acquisition or for "normal" operation do not affect the circuit pole. The ratio of loop bandwidth, $W_0$ to circuit pole Wp1, varies only linearly, thus making the phase locked loop more stable during the bandwidth adjustment.

The invention and objects and features thereof will be more readily apparent from the following description and appended claims when taken with the drawings.

BRIEF DESCRIPTION OF THE DRAWINGS

Like elements in the several figures have the same reference numerals.

DETAILED DESCRIPTION OF ILLUSTRATIVE EMBODIMENTS

Figure 2:
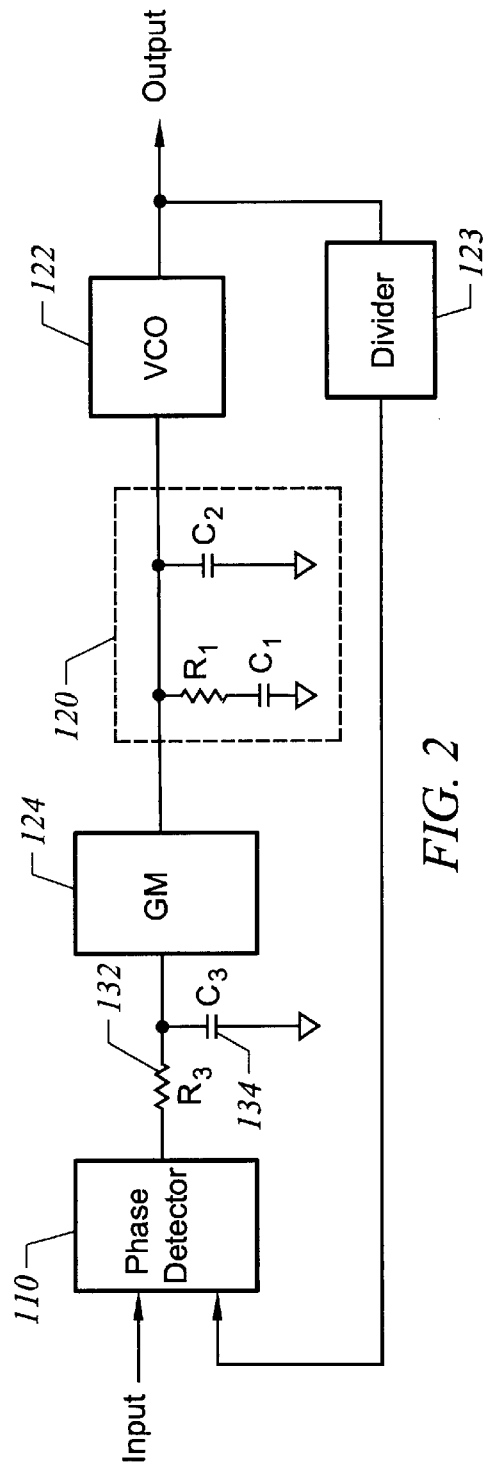
FIG. 2 is a phase locked loop circuit having a transconductance amplifier as described in co-pending application Ser. No. 09/540,243, supra.

Disclosed in co-pending application Ser. No. 09/540,243, supra, is a locked loop for use in a high frequency application such as an optical transceiver. As shown in FIG. 2, the locked loop includes a detector 110, a transconductance (gm) amplifier 124, a loop filter 120, and an oscillator 122. The detector (which can be a phase detector or a frequency detector, or combination of both) receives an input signal and a reference signal and provides a detector output signal indicative of the difference between the input and reference signals. The difference can be phase or frequency, etc., depending on the application. The gm amplifier receives and converts the detector output signal to a current signal. The loop filter receives and filters the current signal with a particular transfer function to provide a control signal. The oscillator receives the control signal and provides an oscillator signal (e.g., a clock) having a property (e.g., frequency) that is adjusted by the control signal. Resistor 132 and capacitor 134 represent a high frequency pole which is not significant to circuit operation and can be ignored.

Figure 1:
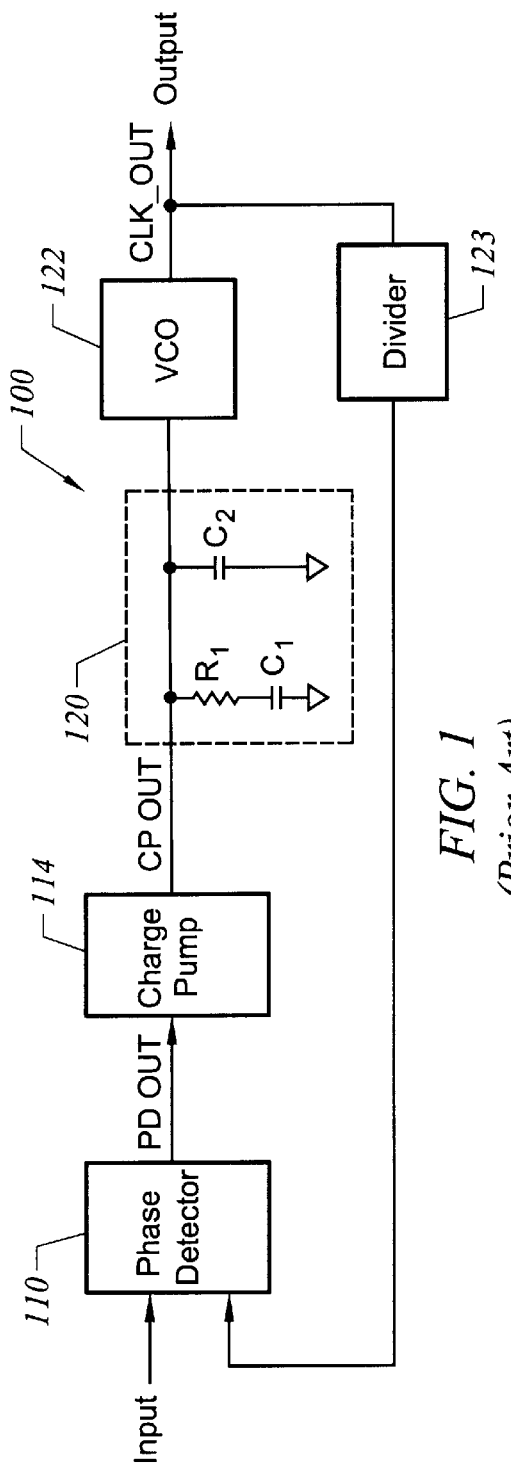
FIG. 1 is a conventional phase locked loop circuit including a charge pump.

Acquisition time (or settling time) of a PLL is inversely proportional to its bandwidth. In general, for a PLL with passive filter, the bandwidth, W0, can be expressed in terms of VCO gain, Kvco, the filter primary resistor, R1, and the gain of phase detector/charge pump block, K1 (FIG. 1).

$$W0=K1*R1*Kvco$$

In the case of gm based PLL (FIG. 2), this equation still applies where K1 represents the product of phase detector gain, Kpd, and gm cell's, gm. K1=Kpd*gm. Hence: W0=Kpd*gm*R1*Kvco.

Figure 3:
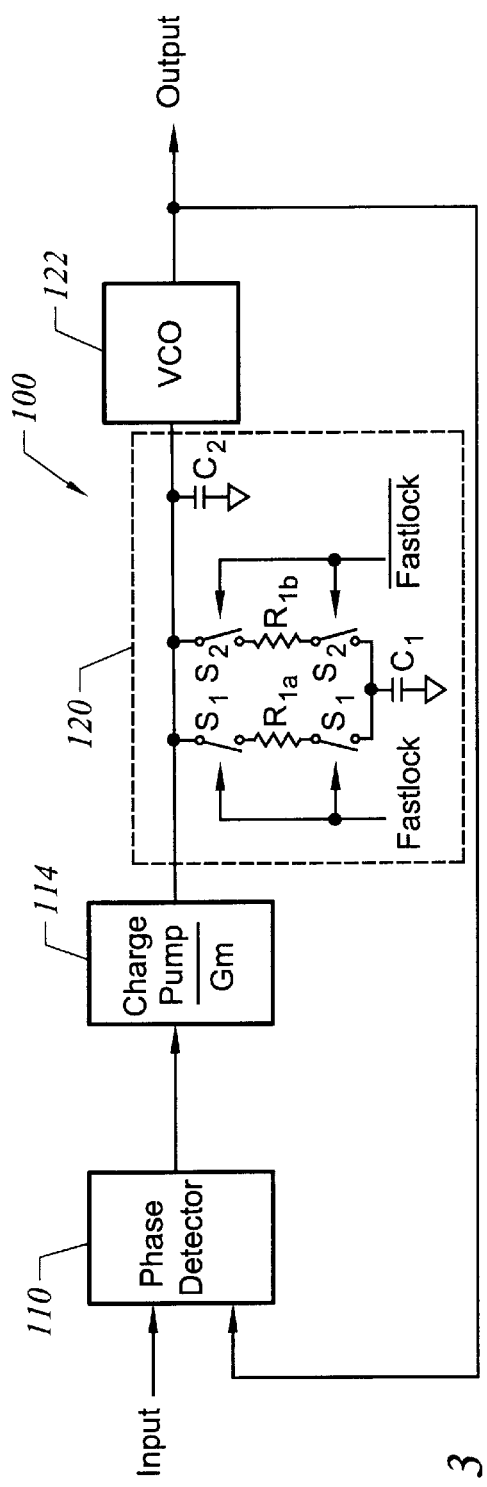
FIG. 3 illustrates the circuit of FIG. 1 with switches for changing resistance value in the loop filter for bandwidth adjustment.

Traditionally, this bandwidth adjustment is done by switching in and out different R1 resistors (FIG. 3). Basically, during fast acquisition, R1 is increased to R1*a* and it is changed back to the original value R1*b* during normal operation. A digital signal, "fast lock", is provided at the input of the chip to tell the PLL when it should be in the fast acquisition mode and when it should switch back to its normal mode. The PLL loop has a zero, Wz1, and a pole, Wp1, due to the loop filter. This pole and zero are given by the following first order equations:

$$Wz1=1/(R1*C1), Wp1=1/(R1*C2)$$

As it can be seen from these equations, both Wz1 and Wp1 are inversely proportional to R1, whereas the bandwidth is directly proportional. On the other hand, the stability of the PLL loop depends on the ratio of Wp1 and W0. Hence, in the traditional implementation where R1 is increases to shorten the settling time, this ratio is changed in square law fashion (Wp1/W0=1(K1*Kvco*C2*R1$^2$)).

Figure 4:
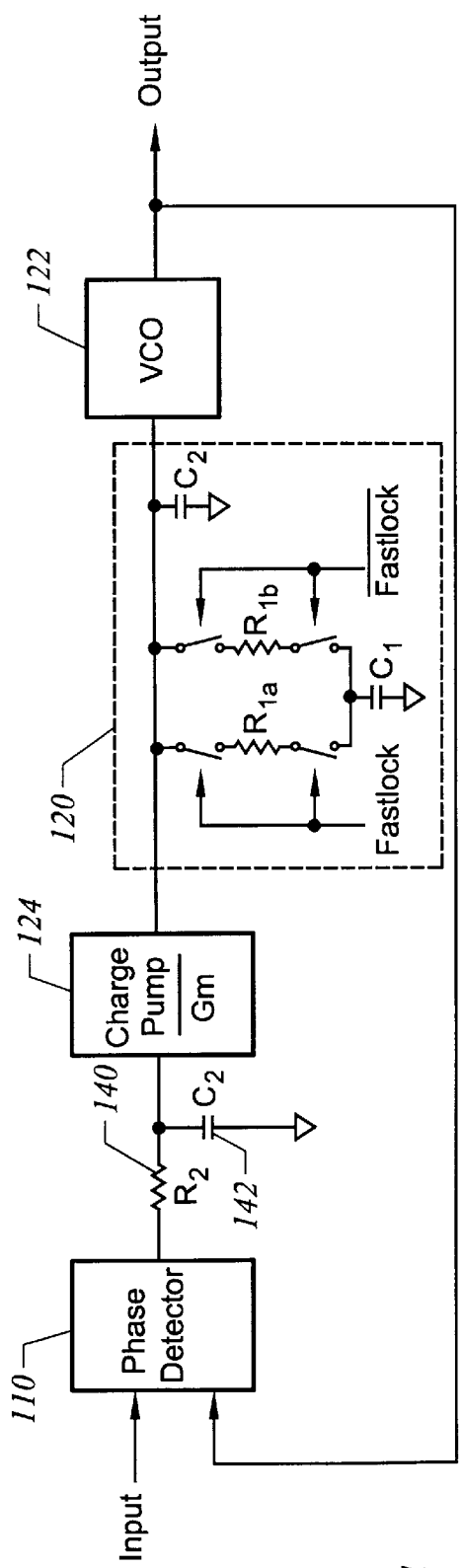
FIG. 4 is the phase locked loop circuit of FIG. 2 as altered to separate the loop pole in accordance with one embodiment of the invention.

FIG. 4 is a schematic of the loop filter as shown in FIG. 2, but with the loop pole taken from filter 120 and placed between phase detector 110 and either a charge pump or transconductance amplifier 124. The high frequency pole of resistor 132 and capacitor 134 from FIG. 2 is not repeated since the high frequency pole is not significant to circuit operation.

In the novel technique of the invention, separation of the pole provides a new pole Wp1 given by 1/(R2*C2), and therefore, when resistor R1 of the loop filter is changed from R1*b* to R1*a* during the fast acquisition time, pole Wp1 is constant and the W0/Wp1 varies only linearly. This feature makes the phase locked loop more stable during this bandwidth adjustment.

Figure 5:
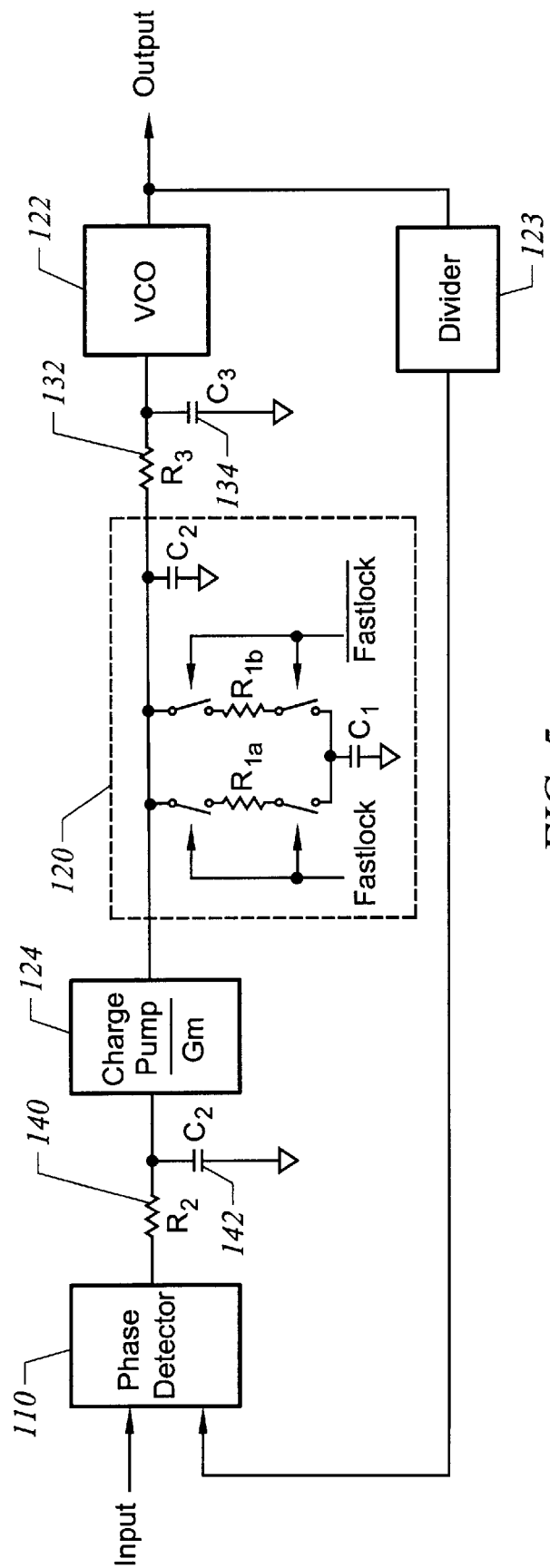
FIG. 5 is the phase locked loop circuit of FIG. 4, further including a high frequency loop pole.

The additional high frequency pole, Wp2, formed by resistor R3 (132) and capacitor C3 (134) in FIG. 2, while at high frequency and typically ignored in PLL first order calculations, can be reinserted in the circuit before the VCO 122 as shown in FIG. 5. However, as noted above, this high frequency pole is typically ignored and is replaced by the dominant pole Wp1.

By separating the loop pole from the loop filter, stability of the loop during fast acquisition is improved since the loop pole is constant and the ratio of bandwidth, W$_0$ to the pole, Wp1, varies only linearly. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A phase locked loop comprising:
  a) a phase detector coupled to compare an input signal and a reference signal and to generate a difference signal,
  b) a difference signal processing circuit,
  c) a first loop filter including first circuit elements coupling the difference signal from the phase detector to the difference signal processing circuit, the first circuit elements defining a first pole for a loop filter,
  d) a voltage controlled oscillator coupled to said phase detector to produce said reference signal, and
  e) a second loop filter including second circuit elements coupling the difference signal processing circuit to the voltage controlled oscillator, said second loop filter having a transfer characteristic defined in part by said first pole.

2. The phase locked loop as defined by claim 1 wherein the first circuit elements comprise a series resistor and a shunt capacitor.

3. The phase locked loop as defined by claim 2 wherein the second circuit elements comprise a variable resistance in series with a capacitor, the variable resistance being varied between a normal operating resistance and a higher fast acquisition resistance.

4. The phase locked loop as defined by claim 3 and further including a second series resistor and a shunt capacitor coupled between the second loop filter and the voltage controlled oscillator and defining a second pole at a higher frequency than the first pole.

5. The phase locked loop as defined by claim 3 wherein the difference signal processing circuit comprises a transconductance amplifier.

6. The phase locked loop as defined by claim 1 wherein the difference signal processor comprises a charge pump.

7. The phase locked loop as defined by claim 1 wherein the difference signal processing circuit comprises a transconductance amplifier.

8. The phase locked loop as defined by claim 1 and further including third circuit elements coupled between said second loop filter and the voltage controlled oscillator and defining a second pole at a higher frequency than the first pole.

9. The phase locked loop as defined by claim 8 wherein the third circuit elements comprise a second series resistor and a shunt capacitor.

10. A phase locked loop comprising:
  a) a phase detector coupled to compare an input signal and a reference signal and to generate a difference signal,
  b) a difference signal processing circuit,
  c) a first loop filter including first circuit elements coupling the difference signal from the phase detector to the difference signal processing circuit, the first circuit elements defining a first pole for said first loop filter,
  d) a voltage controlled oscillator coupled to said phase detector to produce said reference signal,
  e) a second loop filter including second circuit elements coupling the difference signal processing circuit to the voltage controlled oscillator, said second loop filter having a transfer characteristic defined in part by said first pole, said second loop filter comprising a variable resistance in series with a capacitor, the variable resistance being varied between a normal operating resistance and a higher fast acquisition resistance, and
  f) third circuit elements coupled between said second loop filter and the voltage controlled oscillator and defining a second pole at a higher frequency than the first pole.

* * * * *